United States Patent [19]
Ha

[11] Patent Number: 6,064,623
[45] Date of Patent: May 16, 2000

[54] ROW DECODER HAVING GLOBAL AND LOCAL DECODERS IN FLASH MEMORY DEVICES

[75] Inventor: Im Cheol Ha, Kyoungki-do, Rep. of Korea

[73] Assignee: Hyundai Electronics Industries Co., Ltd., Ichon-shi, Rep. of Korea

[21] Appl. No.: 09/223,384

[22] Filed: Dec. 30, 1998

[30] Foreign Application Priority Data

Dec. 30, 1997 [KR] Rep. of Korea ..................... 97-77990

[51] Int. Cl.[7] ..................................... G11C 8/00
[52] U.S. Cl. .............. 365/230.06; 365/226; 365/185.13; 365/185.33
[58] Field of Search ........................ 365/230.06, 185.17, 365/185.29, 185.33, 185.13, 185.24, 226

[56] References Cited

U.S. PATENT DOCUMENTS

| | | | |
|---|---|---|---|
| 5,249,158 | 9/1993 | Kynett et al. | 365/230.03 |
| 5,309,402 | 5/1994 | Okazawa | 365/218 |
| 5,333,122 | 7/1994 | Ninomiya | 365/189.11 |
| 5,335,198 | 8/1994 | Van Buskirk et al. | 365/185 |
| 5,359,558 | 10/1994 | Chang et al. | 365/189.07 |
| 5,365,486 | 11/1994 | Schreck | 365/222 |
| 5,497,354 | 3/1996 | Sweha et al. | 365/230.06 |
| 5,612,913 | 3/1997 | Cappelletti et al. | 365/185.12 |
| 5,663,923 | 9/1997 | Baitar et al. | 365/230.03 |
| 5,768,188 | 6/1998 | Park et al. | 365/185.03 |
| 5,886,923 | 3/1999 | Hung | 365/185.11 |
| 5,896,340 | 4/1999 | Wong et al. | 365/230.03 |

FOREIGN PATENT DOCUMENTS

| | | |
|---|---|---|
| 4-206094 | 7/1992 | Japan . |
| 5-159586 | 6/1993 | Japan . |
| 5-275657 | 10/1993 | Japan . |
| 5-334885 | 12/1993 | Japan . |
| 6-332797 | 12/1994 | Japan . |
| 8-190796 | 7/1996 | Japan . |

*Primary Examiner*—David Nelms
*Assistant Examiner*—Thong Le
*Attorney, Agent, or Firm*—Jacobson, Price, Holman & Stern, PLLC

[57] ABSTRACT

The present invention relates to a row decoder in a flash memory device; and, more particularly, to a row decoder having global and local row decoders to reduce a loading of the high voltage and a chip area. The row decoder according to the present invention comprises a plurality of global row decoders for generating a first control signal and a second control signal according to an operation mode of the flash memory, wherein each global row decoder produces a first voltage level from a first power supply and a second voltage level from a second power supply, which respectively correspond to the first and second control signals, in response to first and second addresses from a predecoder; and a plurality of local row decoders for selecting a word line selection signal in response to the first and second control signals, wherein each local row decoder produces a third voltage level from a third power supply and a fourth voltage level from a fourth power supply which receives a third address from the predecoder and wherein the first control signal is out of phase from the second control signal.

12 Claims, 3 Drawing Sheets

ROW DECODER HAVING GLOBAL AND LOCAL DECODERS IN FLASH MEMORY DEVICES

FIELD OF THE INVENTION

The present invention relates to a row decoder in a flash memory device; and, more particularly, to a row decoder having global and local row decoders to reduce a loading of the high voltage and a chip area.

DESCRIPTION OF THE PRIOR ART

Generally, since flash memory devices erase data stored in cells by sectors and program data by bytes, the cell data in nonselected sectors should not be erased when those in the selected sectors are erased. Likewise, the nonselected cells should not be programmed when the selected cells are programmed. Accordingly, in the flash memory devices, a memory array blocking has been implemented by sectors; nevertheless, gates of the nonselected cells which are connected to one word line are stressed during a byte programming operation and also drains of the nonselected cells which are connected to a bit line are stressed during the programming operation.

Although the stress caused by the gate is ten times as large as that caused by the drain, the number of the gate connected to the word line is much more than that of the drain connected to the bit line. The reason why many gates are connected to the word line is that an area required to design a row decoder is broader than a column decoder to select the bit line. Furthermore, the row decoder in the flash memory device has different operation voltage levels which are respectively applied to the gates according to the operation mode. For example, an external voltage (Vcc) is applied to the selected word line at a read operation, a positive high voltage (Vpp) at a program operation, and a negative high voltage (-Vpp) at an erase operation, respectively. A nonselected word line is provided with a ground voltage level (Vss) at each operation mode. Accordingly, the row decoder are in need of a larger area in such an integrated memory circuit.

Referring to FIG. 1 illustrating a conventional row decoder, the three kinds of voltage levels are applied to a power source terminal VPPXxy. That is, if a sector is selected, voltage Vcc is applied to the power source terminal VPPXxy at a read mode, voltage Vpp at a program mode, and 2V an erase mode, respectively. If the sector is not selected, Vcc voltage is applied to the power source terminal VPPXxy at each operation mode. A back bias of small-sized PMOS transistors hp1 to hp3, which are coupled to the power source terminal VPPXxy, is provided by the power source terminal VPPXxy. A voltage level on the power source terminal VPPXxy is transferred to an output terminal through the PMOS transistor hp3. Two sources of the PMOS transistor hp1 and hp2 and two gates of the PMOS transistor hp3 and an NMOS transistor thn1 are coupled to each other at node B. The output terminal of the row decoder is coupled to a gate of the PMOS transistor hp2 and a drain of the PMOS transistor hp3. Furthermore, the NMOS transistor thn1 is formed on a P-well of a triple well in which voltage Vcc is applied to an N-well.

Row addresses from a predecoder may be divided into three address combinations XAPREDk, XBPREDm and XCPREDn. The row address combinations XBPREDm and XCPREDn and a select signal SECTxy are input into a NAND gate ID1. An output terminal of the NAND gate ID1 is coupled, at node A, to a source of the NMOS transistor hn1 which couples node A to node B in response to the row address combination XAPREDk. Also, in order to provide negative voltage (-VPP) level for the output terminal at the erase mode, an erase terminal VEEXxy is coupled to a source of the NMOS transistor thn1.

If the sector is not selected at the read mode, the voltage Vcc is applied to the power source terminal VPPXxy and 0V is applied to a control terminal XRST and the erase terminal VEEXxy. In order to select a word line at the read mode, nodes A and B should be in a low level state. At this time, the NMOS transistor hn1 is turned on so that node B is connected to a ground voltage level through the NAND gate ID1. For example, when the select signal SECTxy and the address combinations XAPREDk, XBPREDm and XCPREDn are in high level state, node A and B are in low level state.

At the program mode, the positive high voltage Vpp is output through the output terminal WL only when nodes A and B are in a low level state. When the select signal SECTxy is in a low level state, the word line may be not selected.

At the erase mode, the address combination XAPREDk is in a low level state so that the NMOS transistor hn1 is turned off. If a sector is selected, 2V and -Vpp voltage levels are applied to the power source terminal and the erase terminal VEEXxy, respectively.

With respect to each operation mode in FIG. 1, detailed operations are illustrated in the following table <1>:

TABLE 1

| Mode | Sector | VPPXxy | VEEXxy | XRSTxy | Node A | XAPRD | Node B | WL |
|---|---|---|---|---|---|---|---|---|
| Read | SEL | Vcc | 0 V | 0 V | 0 V | Vcc | 0 V | Vcc |
|  |  |  |  |  |  | 0 V | Vcc | 0 V |
|  |  |  |  |  | Vcc | Vcc | Vcc | 0 V |
|  |  |  |  |  |  | 0 V | Vcc | 0 V |
|  | NONSEL | Vcc | 0 V | 0 V | Vcc |  | Vcc | 0 V |
| Program | SEL | Vpp | 0 V | Vpp | 0 V | Vcc | 0 V | Vpp |
|  |  |  |  |  |  | 0 V | Vpp | 0 V |
|  |  |  |  |  | Vcc | Vcc | Vpp | 0 V |
|  |  |  |  |  |  | 0 V | Vpp | 0 V |
|  | NONSEL | Vcc | 0 V | 0 V | Vcc |  | Vpp | 0 V |
| Erase | SEL | 2 V | -Vpp | 0 V | 0 V | 0 V | 2 V | -Vpp |
|  |  |  |  |  |  | 0 V | 2 V | -Vpp |
|  |  |  |  |  | Vcc | 0 V | 2 V | -Vpp |
|  |  |  |  |  |  | 0 V | 2 V | -Vpp |
|  | NONSEL | Vcc | 0 V | 0 V | Vcc | 0 V | Vcc | 0 V |

TABLE 1-continued

| Mode | Sector | VPPXxy | VEEXxy | XRSTxy | Node A | XAPRD | Node B | WL |
| --- | --- | --- | --- | --- | --- | --- | --- | --- |

SEL: selection
NONSEL: nonselection

However, at the read mode, the time required to select the word line is determined by the size of the PMOS transistor hp2 and also the time for nonselection is determined by the size of the NMOS transistor thn1. Furthermore, the above row decoder is complicate with a large chip area and it takes a lot of time to generate the pumping voltage (Vpp) from the power supply (Vcc).

SUMMARY OF THE INVENTION

It is, therefore, an object of the present invention to provide a row decoder in flash memory devices capable reducing the time required to generate positive and negative high voltage at program and erase modes.

In accordance with an aspect of the present invention, there is provided a row decoder in a flash memory device comprising: a plurality of global row decoders for generating a first control signal and a second control signal according to an operation mode of the flash memory, wherein each global row decoder includes a plurality of first voltage applying means for producing a first voltage level from a first power supply and a second voltage level from a second power supply, which respectively correspond to the first and second control signals, in response to first and second addresses from a predecoder; and a plurality of local row decoders for selecting a word line selection signal in response to the first and second control signals, wherein each local row decoder includes a plurality of second voltage applying means for producing a third voltage level from a third power supply and a fourth voltage level from a fourth power supply which receives a third address from the predecoder and wherein the first control signal is out of phase from the second control signal. dr

BRIEF DESCRIPTION OF THE DRAWINGS

The above and other and features of the present invention will become apparent from the following description of the preferred embodiments given in conjunction with the accompanying drawings, in which.

DETAILED DESCRIPTION OF THE PREFERRED EMBODIMENTS

Hereinafter, a row decoder according to the present invention will be described referring to the accompanying drawings.

Figure 2:
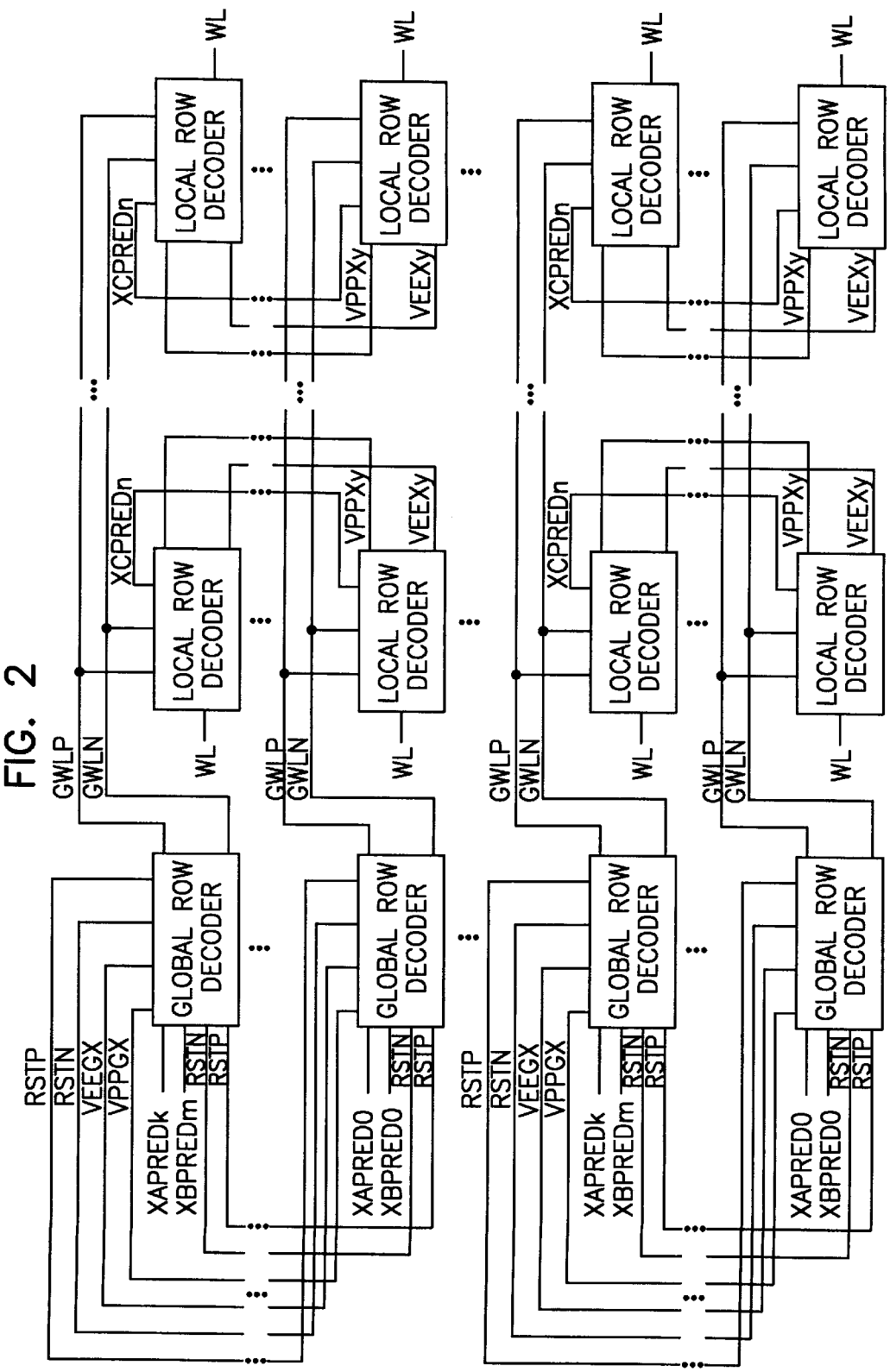
FIG. 2 is a circuit diagram illustrating a row decoder which includes global row decoders and local row decoders in accordance with the present invention.

FIG. 2 is a circuit diagram illustrating the row decoder which includes global row decoders and local row decoders in accordance with the present invention. As shown in FIG. 2, a plurality of local row decoders are connected to one global row decoder. The global row decoder receiving row sector addresses (x) selects a group of the local row decoder and the local row decoder receiving column sector address (y) selects a specific word line.

Figure 1:
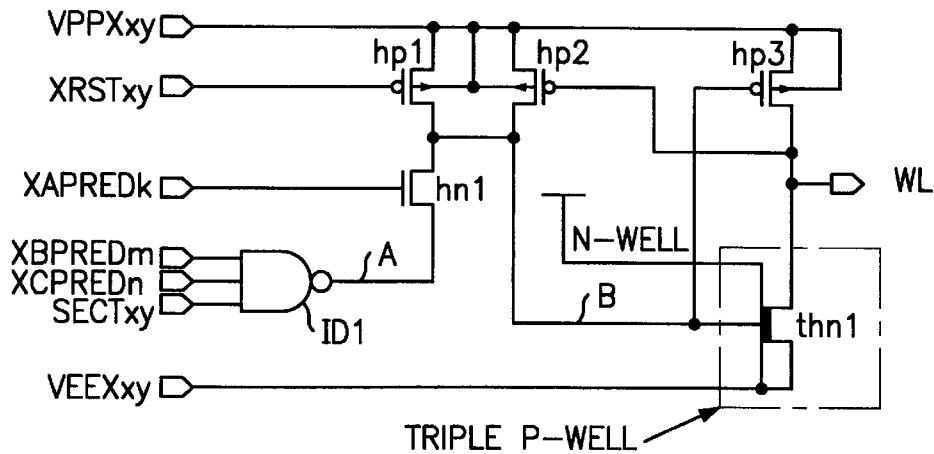
FIG. 1 is a circuit diagram illustrating a conventional row decoder.
Figure 3:
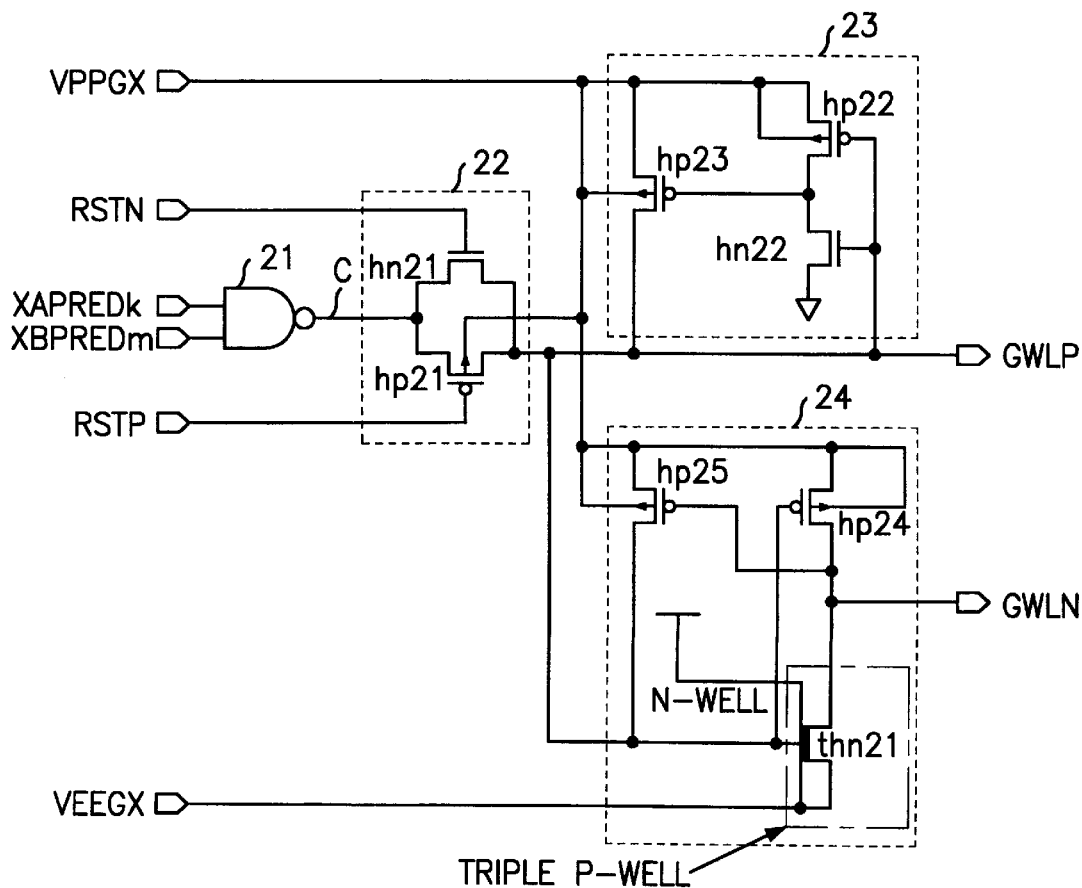
FIG. 3 is a circuit diagram illustrating the global row decoder of FIG. 2.

Referring to FIG. 3, the row decoder according to the present invention includes a NAND gate 21 receiving address combinations XAPREDk and XBPREDm from a predecoder, a switching part 22 for transferring the output from the NAND gate 21, a first signal generating part 23 for producing a first global word line signal GWLP and a second signal generating part 24 for producing a second global word line signal GWLN. Also, the first and second global word line signals GWLP and GWLN are produced in response to the output from the NAND gate 21.

A global power source terminal VPPGX is provided with Vcc, Vpp and 2V at read, program and erase modes, respectively. A global erase terminal VEEGX is provided with −Vpp only at the erase mode. At read and program modes, the output (node C) from the NAND gate 21 receiving the address combinations XAPREDk and XBPREDm may be "0" or "1" in a binary logic state. Accordingly, logic states of the first and second global word line signals GWLP and GWLN to select a row sector are determined by the voltage level of node C.

The first signal generating part 23 includes a PMOS transistor hp23 and an inverter having a PMOS transistor hp22 and an NMOS transistor hn22. A back bias for the PMOS transistors hp22 and hp23 is provided by the global power source terminal VPPGX. The PMOS transistor hp23 transfers a voltage level on the global power source terminal VPPGX to the output terminal in response to the output from the inverter of which input terminal is coupled to the output terminal thereof.

The second signal generating part 24 includes a PMOS transistor hp25 and an inverter having a PMOS transistor hp24 and an NMOS transistor thn21. A back bias for the PMOS transistors hp24 and hp25 is also provided by the global power source terminal VPPGX. The PMOS transistor hp25 transfers a voltage level on the global power source terminal VPPGX to a gate of the NMOS transistor thn21 which is formed in a triple P-well. The global erase terminal VEEGX, which provides an erase voltage −Vpp, is coupled to a source of the NMOS transistor thn21.

As a result, the row decoder according to the present invention outputs different voltage levels in response to the voltage level on node C and the input voltage which applied to the global power source terminal VPPGX and the global erase terminal VEEGX. If the output from the NAND gate 21 is in a low voltage level and the output therefrom is transferred to the first and second signal generating parts 23 and 24 in response to the control signals RSTN and RSTP, the first and second global word line signals GWLP and GWLN are produced according to the input voltage applied to the global power source terminal VPPGX and the global erase terminal VEEGX.

When a voltage Vcc is applied to the global power source terminal VPPGX at the read modes, the first and second global word line signals GWLP and GWLN are either 0V or Vcc in response to the voltage level on node C.

At the program mode, when a positive high voltage Vpp is applied to the global power source terminal VPPGX, the first and second global word line signals GWLP and GWLN are either 0V or Vpp in response to the voltage level on node C.

On the other hand, at the erase mode, when a voltage of 2V is applied to the global power source terminal VPPGX and a voltage −Vpp is applied to the global erase terminal VEEGX, the first and second global word line signals GWLP and GWLN may be either 2V or −Vpp in response to the voltage level (Vcc) on node C.

With respect to each operation mode in FIG. 2, detailed operations are illustrated in the following table <2>:

TABLE 2

| Mode | VPPGX | VEEGX | RSTN | RSTP | Node C | GWLP | GWLN |
|---|---|---|---|---|---|---|---|
| Read | Vcc | 0 V | Vcc | 0 V | 0 V(S)<br>Vcc(N) | 0 V(S)<br>Vcc(N) | Vcc(S)<br>0 V(N) |
| Program | Vpp | 0 V | Vcc | Vpp | 0 V(S)<br>Vcc(N) | 0 V(S)<br>Vpp(N) | Vpp(S)<br>0 V(N) |
| Erase | 2 V | −Vpp | 2 V | Vcc | Vcc | 2 V | −Vpp |

S: selection
N: nonselection

Each of the first and second global word line signals GWLP and GWLN is used for selecting one of local decoders associated with sectors. Further, the number of the global row decoder in implementing the present invention may be small because the word lies in the local row decoders can be selected by the address combination XCPRED which is not used in the global row decoder. Accordingly, the chip size required to design the global row decoder according to the present invention may be considerably small.

Figure 4:
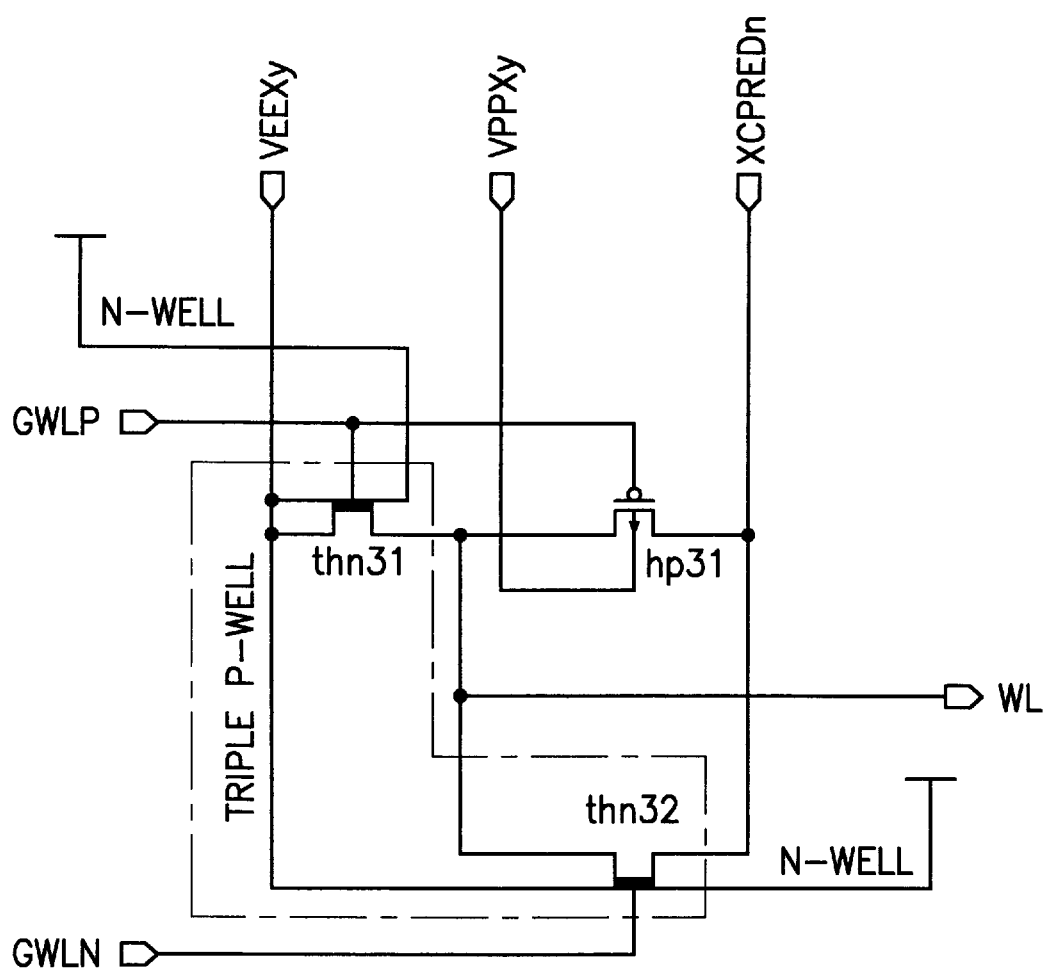
FIG. 4 is a circuit diagram illustrating a local row decoder of FIG. 2.

FIG. 4 is a circuit diagram illustrating the local row decoder according to the present invention. The local row decoder includes two NMOS transistors thn31 and thn32 formed in a triple P-well and a PMOS transistor hp31 and a voltage Vcc is applied to an N-well of the triple well. The first global word line signal GWLP is applied to gates of the PMOS transistor hp31 and the NMOS transistor thn31 and the second global word line signal GWLN is applied to gate of the NMOS transistor thn32. Furthermore, a back bias of the PMOS transistor hp31, into which the address combination XCPREDn is input, is provided by a power source terminal VPPXy associated with column sector addresses.

As illustrated in table <2>, the first and second global word line signals GWLP and GWLN are produced out of phase in FIG. 2. The NMOS transistor thn31 and the PMOS transistor hp31 are connected to each other between an erase power terminal VEEXy and an input terminal through which the address combination XCPREDn is input. The first global word line signal GWLP is applied to the gates of the NMOS transistor thn31 and the PMOS transistor hp31. The NMOS transistor thn32, which is controlled by the second global word line signal GWLN, is in parallel coupled to the PMOS transistor hp31. The address combination XCPRED is output into the output terminal WL through the PMOS transistor hp31 or the NMOS transistor thn32 in response to the first and second global word line signals GWLP and GWLN. The NMOS transistor thn31 is used for transferring the erase high voltage (−Vpp) level to the output terminal WL.

Voltages Vcc, Vpp and 2V are applied to the power source terminal VPPXy at the read, program and erase modes, respectively. Also, a voltage −Vpp is applied to an erase power source terminal VEEXy only at the erase mode. The address combination XCPRED (2") is in a Vcc voltage level when the sector is selected at the read mode, in a Vpp voltage level at the program mode, or in a −Vpp voltage level at the erase mode.

With respect to each operation mode in FIG. 3, detailed operations are illustrated in the following table <3>:

TABLE 3

| Mode | GWLP/GWLN | VPPXy | VEEXy | XCPRED | WL |
|---|---|---|---|---|---|
| Read | S | | | S(Vcc) | Vcc |
| | (GWLP=0 V/ | S(Vcc) | S(0 V) | N(0 V) | 0 V |
| | GWLN=Vcc) | N(Vcc) | N(0 V) | N(Vcc) | 0 V |
| | N | | | S(Vcc) | 0 V |
| | (GWLP=Vcc/ | S(Vcc) | S(0 V) | N(0 V) | 0 V |
| | GWLN=0 V) | N(Vcc) | N(0 V) | N(0 V) | 0 V |
| Program | S | | | S(Vpp) | Vpp |
| | (GWLP=0 V/ | S(Vpp) | S(0 V) | N(0 V) | 0 V |
| | GWLN=Vcc) | N(Vcc) | N(0 V) | N(0 V) | 0 V |
| | N | | | S(Vpp) | 0 V |
| | (GWLP=Vpp/ | S(Vpp) | S(0 V) | N(0 V) | 0 V |
| | GWLN=0 V) | N(Vcc) | N(0 V) | N(0 V) | 0 V |
| Erase | | | S(−Vpp) | 0 V | −Vpp |
| | (GWLP=2 V/ | | N(0 V) | 0 V | 0 V |
| | GWLN=−Vpp | 2 V | S(−Vpp) | 0 V | −Vpp |
| | | | N(0 V) | 0 V | 0 V |

S: selection
N: nonselection

As stated above, in the local row decoder according to the present invention, the PMOS transistor ph31 and the NMOS transistor thn32 are employed to apply different voltage levels to the selected word line and the voltage levels are provided by one of the address combination from the predecoder. Accordingly, it is possible to reduce the area of the row decoder by adopting the global and local row decoder scheme. Furthermore, the small-sized PMOS transistor contributes to the integration of the row decoder and the loading of the high voltage to be input into the terminal VPPXy may be reduced by forming the PMOS transistor in the N-well.

While the present invention has been disclosed with respect to certain preferred embodiments only, other modifications and variations may be made without departing from the spirit and scope of the present invention as set forth in the following claims.

What is claimed is:

1. A row decoder in a flash memory device comprising:
   a plurality of global row decoders for generating a first control signal and a second control signal according to an operation mode of the flash memory, wherein each global row decoder produces a first voltage level from a first power supply and a second voltage level from a second power supply, which respectively correspond to the first and second control signals, in response to first and second addresses from a predecoder; and
   a plurality of local row decoders for selecting a word line selection signal in response to the first and second control signals, wherein each local row decoder produces a third voltage level from a third power supply and a fourth voltage level from a fourth power supply which receives a third address from the predecoder.

2. The row decoder as recited in claim 1, wherein the first control signal is out of phase from the second control signal.

3. The row decoder as recited in claim 2, wherein the first control signal has a ground voltage level or an external power supply voltage level at a read mode, the ground voltage level or a positive pumping voltage level at a program mode and a positive voltage level at an erase mode and wherein the second control signal has the external power supply voltage level or the ground voltage level at the read mode, the positive pumping voltage level or the ground voltage level at the program mode and a negative pumping voltage level at the erase mode.

4. The row decoder as recited in claim 3, wherein the word line selection signal has the external power supply voltage level at the read mode, the positive pumping voltage level at the program mode and a negative pumping voltage level at the erase mode when the word line is selected.

5. The row decoder as recited in claim 1, wherein the first power supply provides an external power supply voltage level at a read mode, a positive pumping voltage level at a program mode and a positive voltage level at an erase mode, wherein the second power supply provides a ground voltage level at the read and program modes and a negative pumping voltage level at the erase mode, and wherein the global row decoder comprises:

a first signal generating means for, in response to a third control signal, transferring a voltage level applied to the first power supply to an output terminal thereof in order to produce the first control signal;

a second signal generating means for, in response to the third control signal, transferring a voltage level applied to the second power supply to the output terminal thereof in order to produce the second control signal;

a control signal generating means for receiving the first and second addresses in order to produce the third control signal; and a switching means for providing the third control signal for the first and second signal generating means in response to a fourth control signal.

6. The row decoder as recited in claim 5, wherein the first signal generating means comprises:

an inverting means for inverting the third control signal; and a first transfer transistor for transferring the voltage level applied to the first power supply to the output terminal in response to an output from the inverting means.

7. The row decoder as recited in claim 5, wherein the second signal generating means comprises:

a first transfer transistor for transferring the voltage level applied to the first power supply to the output terminal in response to the third control signal; and a second transfer transistor for transferring the voltage level applied to the second power supply to the output terminal in response to the third control signal.

8. The row decoder as recited in claim 5, wherein the control signal generating means comprises an NAND gate for receiving the first and second addresses.

9. The row decoder as recited in claim 7, wherein the second signal generating means further comprises a third transfer transistor for increasing a voltage level of the third control signal.

10. The row decoder as recited in claim 7, wherein the second transfer transistor is formed in a triple P-well.

11. The row decoder as recited in claim 1, wherein the third power supply provides a ground voltage level at read and program modes and a negative pumping voltage level at an erase mode and wherein the fourth power supply provides the external voltage level at the read and the positive pumping voltage level at the program mode and the ground voltage level at the erase mode, and wherein the local row decoder comprises:

a first transistor for, in response to the first control signal, transferring a voltage level applied to the third power supply to an output terminal thereof in order to produce the word line selection signal;

a second transistor for, in response to the first control signal, transferring a voltage level applied to the fourth power supply to an output terminal thereof in order to produce the word line selection signal; and a third transistor for, in response to the second control signal, transferring a voltage level applied to the fourth power supply to the output terminal thereof in order to produce the word line selection signal.

12. The row decoder as recited in claim 11, wherein the first and third transistor are formed in a triple P-well.

* * * * *